United States Patent
Jochym et al.

(10) Patent No.: US 6,787,708 B1
(45) Date of Patent: Sep. 7, 2004

(54) PRINTED CIRCUIT BOARD DEBUG TECHNIQUE

(75) Inventors: Daniel A. Jochym, Dowingtown, PA (US); James C. Witte, Phoenixville, PA (US); Michael John Bradley, Phoenixville, PA (US)

(73) Assignee: Unisys Corporation, Blue Bell, PA (US)

( * ) Notice: Subject to any disclaimer, the term of this patent is extended or adjusted under 35 U.S.C. 154(b) by 362 days.

(21) Appl. No.: 09/717,451

(22) Filed: Nov. 21, 2000

(51) Int. Cl.[7] .................................................. H05K 1/16
(52) U.S. Cl. ..................... 174/260; 174/261; 174/262; 361/760; 361/792; 716/15
(58) Field of Search ................................ 174/260, 261, 174/255, 262; 361/760, 761, 777, 792, 795, 803, 793, 794; 257/783, 698; 439/324, 516; 716/15

(56) References Cited

U.S. PATENT DOCUMENTS

| | | | |
|---|---|---|---|
| 3,729,816 A | 5/1973 | Burns .......................... | 29/593 |
| 4,012,693 A | 3/1977 | Sullivan ................. | 324/73 PC |
| 4,566,184 A | 1/1986 | Higgins et al. ............... | 29/840 |
| 5,002,895 A | 3/1991 | LeParquier et al. ............ | 437/8 |
| 5,121,297 A * | 6/1992 | Haas .......................... | 361/751 |
| 5,309,327 A | 5/1994 | Slater ......................... | 361/805 |
| 5,432,677 A * | 7/1995 | Mowatt et al. ............ | 361/719 |
| 5,548,884 A | 8/1996 | Kim ........................... | 29/593 |
| 5,598,096 A | 1/1997 | Pham et al. ............. | 324/158.1 |
| 5,751,597 A | 5/1998 | Okano et al. ................ | 364/491 |
| 5,856,636 A * | 1/1999 | Sanso .......................... | 174/255 |
| 5,915,755 A | 6/1999 | Gochnour et al. ............ | 29/843 |
| 6,025,731 A | 2/2000 | Hembree et al. ........... | 324/758 |
| 6,103,978 A * | 8/2000 | Amir .......................... | 174/255 |
| 6,243,655 B1 * | 6/2001 | Caggiano et al. ........... | 702/117 |
| 6,388,890 B1 * | 5/2002 | Kwong et al. .............. | 361/780 |
| 6,433,562 B1 * | 8/2002 | McAllister et al. ......... | 324/754 |
| 6,469,530 B1 * | 10/2002 | Johnson et al. ............. | 324/754 |
| 6,535,398 B1 * | 3/2003 | Moresco ..................... | 361/792 |

* cited by examiner

*Primary Examiner*—Kamand Cuneo
*Assistant Examiner*—I B Patel
(74) *Attorney, Agent, or Firm*—Michael B. Atlass; Mark T. Starr; Woodcock Washburn LLP

(57) ABSTRACT

A computer-aided design (CAD) tool is used to create a preliminary design of a mulit-layered printed circuit board, comprising a layout of electrical components on a main region of a printed circuit board and a routing of signal traces among the lectical components within the main region. An extended region is then added to the design on the CAD tool that comprises a layout of selected debug connectors on the extended region and at least one additional signal layer. Traces connecting the debug connectors to selected vias of the main region of the printed circuit board are then routed on the added signal layer only. A prototype board is then created and tested. Once testing is complete, the extended region and the at least one additional layer are removed from the design in the CAD tool without disturbing the layout of components and routing of signal traces on the main region of the printed circuit board.

11 Claims, 4 Drawing Sheets

| | |
|---|---|
| | Top Layer 300 |
| Pre-Preg 355 | Debug Layer 1 320 |
| Dielectric Core 360 | Ground 315 |
| Pre-Preg 355 | Signal Layer 1 305 |
| Dielectric Core 360 | Signal Layer 2 310 |
| Pre-Preg 355 | Voltage 330 |
| Dielectric Core 360 | Ground 316 |
| Pre-Preg 355 | Signal Layer 3 340 |
| Dielectric Core 360 | Signal Layer 4 345 |
| Pre-Preg 355 | Ground 317 |
| Dielectric Core 360 | Debug Layer 2 325 |
| Pre-Preg 355 | Bottom Layer 350 |

PRINTED CIRCUIT BOARD DEBUG TECHNIQUE

FIELD OF THE INVENTION

This invention relates generally to printed circuit board manufacturing and more specifically to a method of designing and testing printed circuit boards.

BACKGROUND OF THE INVENTION

Printed circuit boards (PCB) are flat boards that electrically connect different components of a circuit through copper tracks called traces. Today, PCB's are ubiquitous. They can be found in personal computers, cell phones, personal data assistants (PDAs) and so on.

Any printed circuit board (PCB) that contains a number of components (memory chips, processors, I/O chips, and other logic chips) must be designed with debugging in mind. A computer-aided design (CAD) tool is usually employed to "layout" the chips on the board and then to perform "routing" of signal lines (called "traces") on the board. The board may be designed with multiple layers in order to accommodate the large number of traces in the design. To support debugging, printed circuit boards are often designed with debug or monitor connectors included on the board that provide connections to various critical traces on the board. A prototype board can then be tested with, for example, a logic analyzer, by connecting the probes of the analyzer to the debug connectors. After the debug phase is complete, the debug connectors are removed from the design, and the board is "re-routed" without them.

There are two problems with this approach. First, it takes time to completely re-route the board after the debug phase. Second, the re-routed board is physically, and thus electrically, different than the original debug version. This can change the electrical characteristics of the board. Consequently, the re-routing step may introduce new errors that will not be caught.

For the foregoing reasons, there is a need for a printed circuit board design methodology that permits effective debugging but that does not require a complete re-routing of the board design after the debug phase. The present invention satisfies this need.

SUMMARY OF THE INVENTION

The present invention is directed to a method and apparatus for designing a printed circuit board that reduces debugging time by not requiring the board to be re-routed after debugging. By reducing the debugging time, the manufacturer can release the product to market faster.

According to the present invention a computer-aided design (CAD) tool is used to create a preliminary design of a multi-layered printed circuit board. The design comprises a layout of the electrical components on a main region of the printed circuit board and a routing of signal traces among the electrical components within the main region. The signal traces are disposed on one or more signal layers of the printed circuit board.

An extended region is then added to the design in the CAD tool without disturbing the original traces on the main region of the printed circuit board. The extended region comprises a layout of selected debug connectors and at least one additional signal layer. Traces connecting the debug connectors to selected vias of the main region of the printed circuit board are then routed on the added signal layer.

A printed circuit board prototype is then manufactured from the design and includes both the extended region and the main region. This board can then be tested using the debug connectors, as needed, to monitor selected signals on the main region of the board.

Once testing is complete, the extended region and the at least one additional layer are removed from the design in the CAD tool without disturbing the layout of components and routing of signal traces on the main region of the printed circuit board. Unlike prior design methods, there is no need to reroute the signal traces of the main region after removal of the extended region. This reduces the chances that new errors will be introduced into the design of the main region.

The advantages of the invention combined with other attributes thereof will become more apparent upon consideration of the ensuing specification, particularly when considered in light of the attached drawings, directed towards particular embodiments of the invention but also illustrative of the underlying concepts thereof.

BRIEF DESCRIPTION OF THE DRAWINGS

The foregoing summary, as well as the following detailed description of the preferred embodiments, is better understood when read in conjunction with the attached drawings. For the purpose of illustrating the invention, there is shown in the drawings embodiments that are presently preferred, it being understood, however, that the invention is not limited to the specific apparatus, system, and instrumentalities disclosed. In the drawings:

FIG. 4 is a cross section of another main region of a printed circuit board according to another preferred embodiment of the present invention.

DETAILED DESCRIPTION

Figure 1:
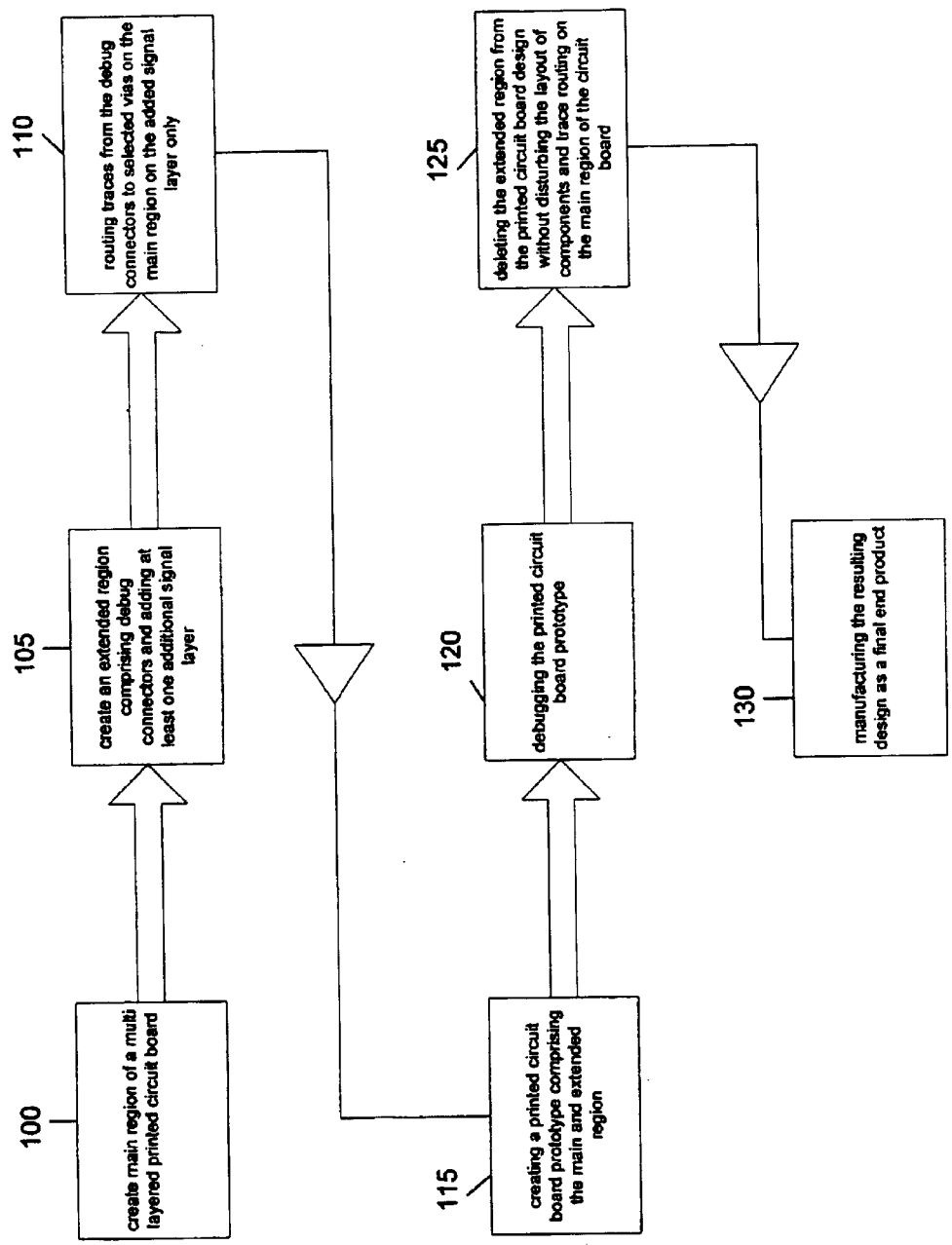
FIG. 1 is a flowchart illustrating a method of designing a printed circuit board according to an embodiment of the present invention.

Referring to the drawings wherein like numerals represent like elements throughout, there is shown in FIG. 1 a method of printed circuit board design in accordance with the principles of the present invention.

As shown, in step 100, a computer-aided design (CAD) tool is used to create a multi-layered printed circuit board design. The design comprises a layout of the electrical components on a main region of the printed circuit board and a routing of signal traces among the electrical components within the main region. The signal traces are disposed on one or more signal layers of the printed circuit board.

In step 105, the CAD tool is used to design an extended region of the printed circuit board. On the extended region is a layout of selected debug connectors and at least one additional signal layer. In step 110, traces connecting the debug connectors to selected vias of the main region of the printed circuit board are then routed on the added signal layer. The trace routing and layout of parts on the original completed design is protected and cannot be changed when adding the extended region.

In step 115, a printed circuit board prototype is then manufactured from the design and includes both the extended region and the main region. In a preferred embodiment, the merging includes adding the additional layer in relation to the other layers of the printed circuit board in a manner that will minimize the electrical effect between the other layers. In the preferred embodiment, the impedance between the signal layers is as required in the main region. Various embodiments of the extended region will be described and illustrated below.

Specifically, the added layers are placed in relation to the existing layers as to minimize any effect on the distance between the existing signal layers. It is important to maintain the impedance between existing signal layers at approximately 75 ohms. The coupling between any ground layers and voltage layers of the existing design must be minimally affected by the addition of the signal layers. Further according to the present invention all of the traces that connect the debug connectors to vias in the main region are routed on the added signal layers only, so that none of the traces or signal layers of the original design are moved or altered.

In step 120, the printed circuit board prototype is tested and debugged for any design errors.

In step 125, the extended region and the at least one additional layer are removed from the design in the CAD tool without disturbing the layout of components and routing of signal traces on the main region of the printed circuit board. The at least one additional layer can be removed without disturbing the main region of the printed circuit because, as stated above, all of the traces that connect the debug connectors to vias in the main region are routed on the added signal layers only, so that none of the traces or signal layers of the original design are moved or altered.

Additionally, since the removal of the extended region and at least one additional layer does not affect the electrical design of the printed circuit board, in step 130, the resulting board can be manufactured as a printed circuit board in accordance with the original design.

Figure 2:
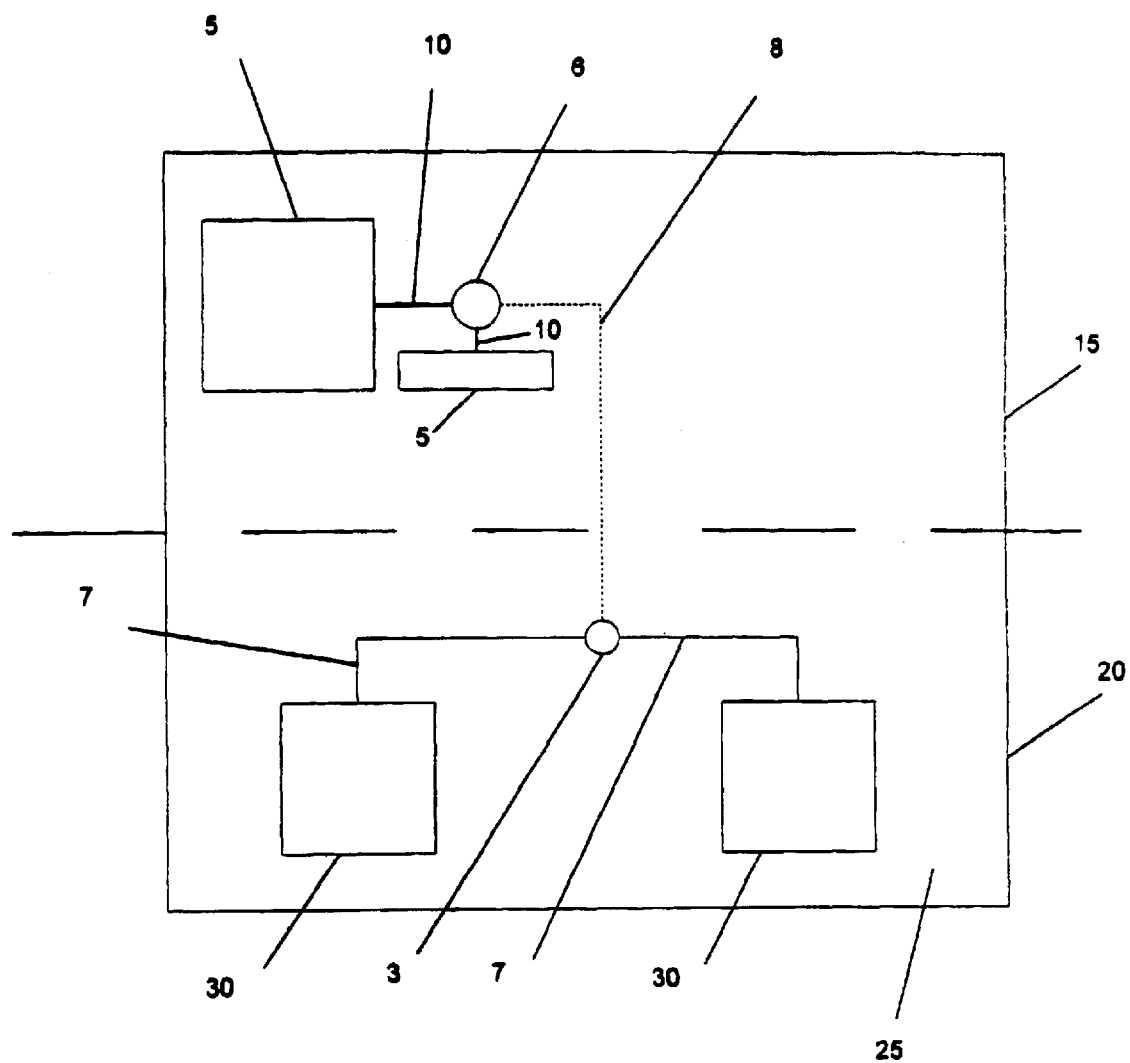
FIG. 2 is a top view of an exemplary printed circuit board prototype according to an embodiment of the present invention.

FIG. 2 shows an exemplary printed circuit board prototype 2 according to an embodiment of the present invention. The board 2 includes a main region 20 having an original board design 25 and an extended region 15. The main region 20 is the original design layout of the electrical components 30 of the printed circuit board 2 and a routing of signal traces 7 among the electrical components 30. The extended region 15 is a layout of selected debug connectors 5, and at least one additional signal layer 8 and trace 10. The traces 10 are routed on the least one additional layer 8 to connect the debug connectors 5 to selected vias 6 on the extended region 15 and to selected vias 3 of the main region 20 of the printed circuit board 2.

Figure 3:
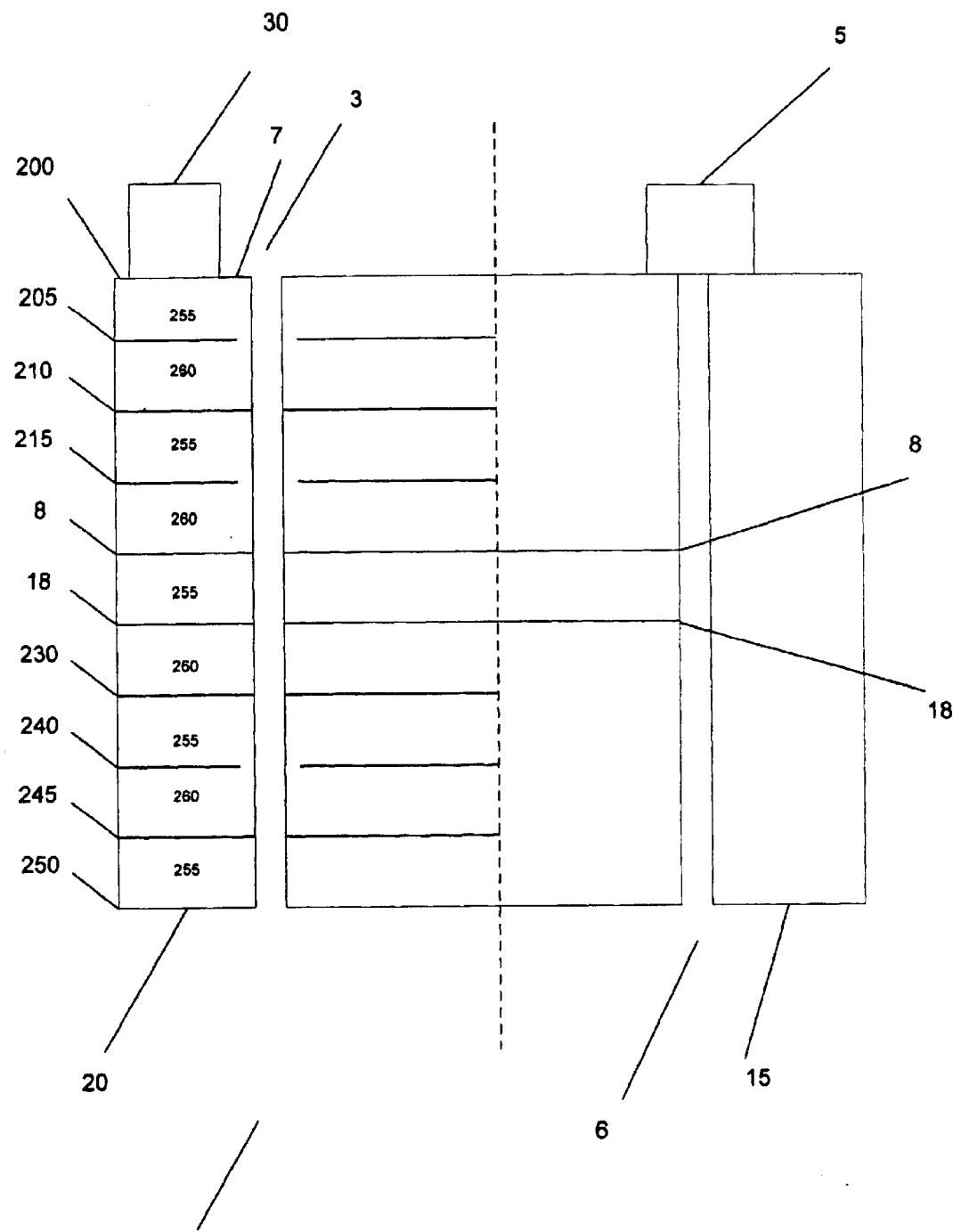
FIG. 3 is a cross section of the printed circuit board prototype of FIG. 2.

FIG. 3 shows a cross section of the exemplary printed circuit board prototype of FIG. 2. The board 2 has a main region 20 and an extended region 15 as discussed above in accordance with an embodiment of the present invention. The main region 20 of the printed circuit board 2 has a top layer 200, a first signal layer 205, a second signal layer 210, a ground layer 215, a voltage layer 230, a third signal layer 240, a fourth signal layer 245, and a bottom layer 250, in that order. In accordance with the method described above, two additional layers, 8, 18 have been added. In this embodiment, the added layers 8, 18 disposed between the ground layer 215 and the voltage layer 230.

Further according to the present invention, all of the traces that connect the debug connectors 5 to via 3 in the main region 20 are routed on the added signal layers 8, 18 only. This design provides that no traces or signal layers of the original design on the main region 20 are moved or altered when the added signal layers 8, 18 are removed.

In FIG. 3, signal layer 210, voltage 230 and signal layer 245 are electrically connected to via 3 in the main region 20 while signal layer 205, ground layer 215 and signal layer 240 are not. Also, both added signal layers 8, 18 are electrically connected to via 3 on the main region 20 and to via 6 on the extended region 15. Debug connectors 5 in the extended region 15 are electrically connected to via 6. This design allows debug connectors 5 to test electrical components 30 on the main region 20 that are also connected to via 3.

The additional signal layers 8, 18 that are placed between the ground layer 215 and the voltage layer 230 are preferably placed such that the spacing between the ground layer 215 and the voltage layer 230 is unchanged. While in FIG. 3 there are two additional debug layers, in other embodiments, any number of debug layers can be used as needed without departing from the principles of the present invention.

Additionally, there are layers of Pre-Preg 255 that separate each signal pair. A signal pair is a substantially planar dielectric core 260 that has a layer of copper or other conductive material surrounding the top and bottom sides of the core. The use of Pre-Preg and signal pairs are common in the field of printed circuit board testing and manufacturing. Pre-Preg 255 and signals pairs are illustrated in this figure for thoroughness of illustration and serve no extra functionality other than their common usage in the field.

FIG. 4 shows a cross section of another main region of a printed circuit board 302 according to another preferred embodiment of the present invention. The main region of the printed circuit board 302 has a top layer 300, a first ground layer 315, a first signal layer 305, a second signal layer 310, a voltage layer 330, a second ground layer 316, a third signal layer 340, a fourth signal layer 345, a third ground layer 317, and a bottom layer 350, in that order. In accordance with the method described above, two additional layers 320, 325 have been added. In this embodiment, one added layer 320 is disposed between the top layer 300 and the first ground layer 315 and another of the additional layers 325 is disposed between the third ground layer 317 and the bottom layer 350.

Additionally, there are layers of Pre-Preg 355 that separate each signal pair. Pre-Preg 355 and signals pairs separated by a dielectric core 360 are illustrated in the figure for thoroughness of illustration and serve no extra functionality other than their common usage in the field.

As the foregoing illustrates, the present invention is directed to a method of printed circuit board design and a prototype printed circuit board used in connection with the same. It is understood that changes may be made to the embodiments described above without departing from the broad inventive concepts thereof. For example, the debug layers in the multi layered printed circuit board can be placed in different locations. Also, materials other than Pre-Preg can be used to separate the signal pairs. Therefore, the spirit and scope of the appended claims should not be limited to the description of the preferred embodiment contained herein.

What is claimed is:

1. A set of at least two types of printed circuit boards having a first type printed circuit board which is a prototype test printed circuit board adapted for testing and having a plurality second type of printed circuit board which is a product circuit board for use in products, wherein said first and second type printed circuit board comprises:

a first plurality of layers, and a main region in which a plurality of electrical components are disposed on said printed circuit board in an electrical design, the electrical components being connected by traces disposed on one or more of said first plurality of layers within said main region;

and wherein only boards of said first type in said set further comprise:

at least one additional layer for testing on which traces are routed that connect from debug connectors to vias within the main region of the printed circuit board, said at least one additional layer having an extended region in which a plurality of debug connectors are disposed, and wherein both the first and second type printed circuit boards have substantially the same electrical design in the main regions thereof.

2. The printed circuit board set recited in claim 1, wherein said at least one additional layer is disposed in relation to said first plurality of layers in said first circuit board type in a manner that minimizes impedance between said first plurality of layers so as to maintain impedance between existing signal layers to substantially 75 Ohms.

3. The set of printed circuit boards set forth in claim 1 wherein said test printed circuit board design comprises a top layer, a first signal layer, a second signal layer, a voltage layer, a ground layer, a third signal layer, a fourth signal layer, and a bottom layer, in that order, and wherein said at least one additional layer is disposed between said ground layer and said voltage layer.

4. The set of printed circuit boards set forth in claim 1 wherein said test printed circuit board design comprises a top layer, a first ground layer, a first signal layer, a second signal layer, a voltage layer, a second ground layer, a third signal layer, a fourth signal layer, a third ground layer, and a bottom layer, in that order, and wherein said one additional layer is disposed between said top layer and said first ground layer and another of said additional layer is disposed between said third ground layer and said bottom layer.

5. A method of designing a multi-layered printed circuit board having a plurality of electrical components thereon, the method comprising:

(a) creating in a computer-aided design (CAD) tool a design of a multi-layered printed circuit board, the design comprising a layout of the electrical components on a main region of the printed circuit board and a routing of signal traces among the electrical components within said main region, the signal traces being disposed on one or more signal layers of the printed circuit board;

(b) adding to the design in the CAD tool an extended region of the printed circuit board, a layout of selected debug connectors on the extended region, and at least one additional signal layer, said at least one additional layer being a test layer, and routing in the CAD tool, on said at least one additional layer, traces connecting the debug connectors to selected vias of the main region of the printed circuit board;

(c) building a test circuit board in accord with said design and having said test layer, (d) testing said built test printed circuit board, using the debug connectors on the extended region thereof; and if there is no need to redesign any of the layers due to errors discovered in testing, else, fixing said errors and thereafter, (e) removing from the design in the CAD tool the extended region and said test layer without disturbing the layout of components and routing of signal traces on the main region of the printed circuit board, and (f) building printed circuit boards for production.

6. The method recited in claim 5, wherein (b) further comprises adding said test layer in relation to the other layers of the printed circuit board in a manner that will minimize the electrical affect said test layer may have on electrical features of said other layers.

7. The method recited in claim 6, wherein (b) further comprises adding said additional layer between a ground layer and a voltage layer of the printed circuit board.

8. The method recited in claim 7, wherein the additional layer is added between the ground layer and the voltage layer without changing the spacing between the ground layer and the voltage layer.

9. The method as recited in claim 5, wherein the design of the printed circuit board comprises a top layer, a first signal layer, a second signal layer, a voltage layer, a ground layer, a third signal layer, a fourth signal layer, and a bottom layer, in that order, and wherein said test layer is disposed between said ground layer and said voltage layer.

10. The method recited in claim 5, wherein the design of the printed circuit board comprises a top layer, a fist ground layer, a first signal layer, a second signal layer, a voltage layer, a second ground layer, a third signal layer, a fourth signal layer, a third ground layer, and a bottom layer, in that order, and wherein a first layer of said test layer is disposed between said top layer and said first ground layer and another layer of said test layer is disposed between said third ground layer and said bottom layer.

11. A printed circuit board manufactured from a design created in accordance with the method of claim 5.

* * * * *